(12) United States Patent
Ramos

(10) Patent No.: US 12,088,266 B2
(45) Date of Patent: *Sep. 10, 2024

(54) SYSTEMS AND METHODS OF VOLUME LIMITING

(71) Applicant: Sonos, Inc., Santa Barbara, CA (US)

(72) Inventor: Aurelio Ramos, Jamaica Plain, MA (US)

(73) Assignee: Sonos, Inc., Santa Barbara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/345,671

(22) Filed: Jun. 30, 2023

(65) Prior Publication Data

US 2023/0353113 A1 Nov. 2, 2023

Related U.S. Application Data

(63) Continuation of application No. 17/096,689, filed on Nov. 12, 2020, now Pat. No. 11,716,065, which is a
(Continued)

(51) Int. Cl.
*H03G 11/00* (2006.01)
*H03G 3/30* (2006.01)
(Continued)

(52) U.S. Cl.
CPC ............ *H03G 11/00* (2013.01); *H03G 3/3005* (2013.01); *H03G 7/002* (2013.01); *H03G 9/025* (2013.01);
(Continued)

(58) Field of Classification Search
CPC ...... H03M 1/0626; H03M 1/12; H03M 1/124; H03M 1/466; H03M 1/0604;
(Continued)

(56) References Cited

U.S. PATENT DOCUMENTS

| | | |
|---|---|---|
| 4,641,361 A | 2/1987 | Rosback |
| 4,912,424 A | 3/1990 | Nicola et al. |
| | (Continued) | |

FOREIGN PATENT DOCUMENTS

| | | |
|---|---|---|
| EP | 0292105 A2 | 11/1988 |
| EP | 1389853 A1 | 2/2004 |
| | (Continued) | |

OTHER PUBLICATIONS

Advisory Action mailed on Oct. 29, 2019, issued in connection with U.S. Appl. No. 15/943,064, filed Apr. 2, 2018, 4 pages.
(Continued)

*Primary Examiner* — Kharye Pope
(74) *Attorney, Agent, or Firm* — Fortem IP LLP

(57) ABSTRACT

Systems and methods for limiting volume in an audio playback device using a feedback controller are disclosed herein. In one example, a gain stage modulates gain of an audio signal based in part on feedback from a downstream limiter. The gain stage receives a first audio signal as well as a feedback signal from the feedback controller. Based at least in part on the feedback signal from the feedback controller, the gain stage modulates a gain of the first audio signal to provide a second audio signal. The second audio signal is delivered to the limiter, which limits the second audio signal to produce an output signal. The output signal is played back via a transducer. The feedback controller receives a gain reduction value from the limiter and determines a feedback signal to provide to the gain stage upstream of the limiter.

20 Claims, 6 Drawing Sheets

Related U.S. Application Data continuation of application No. 15/943,064, filed on Apr. 2, 2018, now Pat. No. 10,862,446.

(51) Int. Cl.
| | |
|---|---|
| *H03G 7/00* | (2006.01) |
| *H03G 9/02* | (2006.01) |
| *H04R 3/00* | (2006.01) |
| *H04H 40/54* | (2008.01) |

(52) U.S. Cl.
CPC ....... *H04R 3/007* (2013.01); *H03G 2201/103* (2013.01); *H04R 2430/01* (2013.01)

(58) Field of Classification Search
CPC ............ H03M 1/0624; H03M 1/0673; H03M 1/0854; H03M 1/0863; H03M 1/1009; H03M 1/1023; H03M 1/121; H03M 1/1295; H03M 1/164; H03M 1/18; H03M 1/182; H03M 1/34; H03M 1/44; H03M 1/50; H03M 1/504; H03M 1/508; H03M 1/66; H03M 1/68; H03M 1/70; H03M 3/414; H03M 3/46; H04R 25/356; H04R 19/005; H04R 2225/43; H04R 2227/005; H04R 25/353; H04R 25/43; H04R 27/00; H04R 29/001; H04R 3/00; H04R 19/04; H04R 3/002; H04R 3/007; H03H 11/1291; H03H 7/0153; H03H 11/1252; H03H 11/1278; H03H 19/004; H03H 2210/025; H03H 2210/028; H03H 2210/036; H03G 3/3078; H03G 3/32; H03G 3/3042; H03G 3/3068; H03G 7/002; H03G 3/001; H03G 3/3052; H03G 7/007; H03G 9/025; H03G 1/0088; H03G 2201/103; H03G 2201/202; H03G 2201/302; H03G 2201/307; H03G 3/3089; H03G 7/06; H03G 9/005; H04S 1/007; H04S 3/002
USPC ..... 381/1, 104, 17, 174, 312, 59, 94.1, 94.2, 381/94.7, 98; 375/345, E1.002, 232, 260, 375/261, 347, 350, E1.001, 146, 150, 375/259, 267, 295, 297, 319, 130, 219, 375/227, 229, 299, 302, 316, 317, 340, 375/344, 349

See application file for complete search history.

(56) References Cited

U.S. PATENT DOCUMENTS

| | | |
|---|---|---|
| 5,172,415 A | 12/1992 | Fosgate |
| 5,440,644 A | 8/1995 | Farinelli et al. |
| 5,761,320 A | 6/1998 | Farinelli et al. |
| 5,923,902 A | 7/1999 | Inagaki |
| 6,032,202 A | 2/2000 | Lea et al. |
| 6,256,554 B1 | 7/2001 | DiLorenzo |
| 6,404,811 B1 | 6/2002 | Cvetko et al. |
| 6,469,633 B1 | 10/2002 | Wachter |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,757,517 B2 | 6/2004 | Chang |
| 6,778,869 B2 | 8/2004 | Champion |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,391,791 B2 | 6/2008 | Balassanian et al. |
| 7,483,538 B2 | 1/2009 | McCarty et al. |
| 7,571,014 B1 | 8/2009 | Lambourne et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,853,341 B2 | 12/2010 | McCarty et al. |
| 7,987,294 B2 | 7/2011 | Bryce et al. |
| 8,014,423 B2 | 9/2011 | Thaler et al. |
| 8,045,952 B2 | 10/2011 | Qureshey et al. |
| 8,103,009 B2 | 1/2012 | McCarty et al. |
| 8,234,395 B2 | 7/2012 | Millington |
| 8,362,936 B2* | 1/2013 | Ledzius ............ H03G 3/3089 341/139 |
| 8,428,277 B1* | 4/2013 | Skoglund ............ H03G 7/002 381/104 |
| 8,483,853 B1 | 7/2013 | Lambourne |
| 8,942,252 B2 | 1/2015 | Balassanian et al. |
| 2001/0042107 A1 | 11/2001 | Palm |
| 2002/0022453 A1 | 2/2002 | Balog et al. |
| 2002/0026442 A1 | 2/2002 | Lipscomb et al. |
| 2002/0124097 A1 | 9/2002 | Isely et al. |
| 2003/0157951 A1 | 8/2003 | Hasty, Jr. |
| 2004/0024478 A1 | 2/2004 | Hans et al. |
| 2005/0058303 A1* | 3/2005 | Martin ............ H03G 9/16 381/98 |
| 2006/0008076 A1* | 1/2006 | Okumura ............ H04R 3/02 379/406.01 |
| 2007/0142944 A1 | 6/2007 | Goldberg et al. |
| 2008/0297257 A1 | 12/2008 | Iwamatsu |
| 2009/0009251 A1 | 1/2009 | Spielbauer |
| 2009/0212855 A1* | 8/2009 | Mitchell ............ H03F 3/45973 327/552 |
| 2012/0060195 A1 | 3/2012 | Fishman et al. |
| 2012/0154037 A1* | 6/2012 | Pfaffinger ............ H03G 7/007 330/129 |
| 2012/0170639 A1* | 7/2012 | Salsbury ............ G05B 13/048 375/233 |
| 2012/0206195 A1* | 8/2012 | Helsloot ............ H03G 9/025 327/552 |
| 2013/0077795 A1* | 3/2013 | Risbo ............ H04R 3/007 381/55 |
| 2014/0254805 A1 | 9/2014 | Su et al. |
| 2015/0010168 A1* | 1/2015 | Cheng ............ H04R 3/007 381/107 |
| 2015/0350783 A1* | 12/2015 | Krishnaswamy ...... H04R 3/007 381/55 |
| 2016/0241960 A1 | 8/2016 | Cheng et al. |
| 2017/0054458 A1 | 2/2017 | Kessel |

FOREIGN PATENT DOCUMENTS

| | | |
|---|---|---|
| WO | 200153994 | 7/2001 |
| WO | 2003093950 A2 | 11/2003 |

OTHER PUBLICATIONS

AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European EPC Article 94.3 mailed on Nov. 18, 2022, issued in connection with European Application No. 19720221.1, 9 pages.
Final Office Action mailed on Aug. 15, 2019, issued in connection with U.S. Appl. No. 15/943,064, filed Apr. 2, 2018, 17 pages.
First Action Interview Office Action mailed on Jul. 10, 2019, issued in connection with U.S. Appl. No. 15/943,064, filed Apr. 2, 2018, 3 pages.

(56) References Cited

OTHER PUBLICATIONS

First Action Interview Office Action mailed on Apr. 23, 2019, issued in connection with U.S. Appl. No. 15/943,064, filed Apr. 2, 2018, 4 pages.
International Bureau, International Preliminary Report on Patentability and Written Opinion, mailed on Oct. 15, 2020, issued in connection with International Application No. PCT/US2019/025204, filed on Apr. 1, 2019, 13 pages.
International Bureau, International Search Report and Written Opinion mailed on Oct. 24, 2019, issued in connection with International Application No. PCT/US2019/025204, filed on Apr. 1, 2019, 17 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action mailed on Sep. 13, 2022, issued in connection with U.S. Appl. No. 17/096,689, filed Nov. 12, 2020, 12 pages.
Non-Final Office Action mailed on Mar. 24, 2022, issued in connection with U.S. Appl. No. 17/096,689, filed Nov. 12, 2020, 15 pages.
Non-Final Office Action mailed on Mar. 3, 2020, issued in connection with U.S. Appl. No. 15/943,064, filed Apr. 2, 2018, 16 pages.
Notice of Allowance mailed on Aug. 11, 2020, issued in connection with U.S. Appl. No. 15/943,064, filed Apr. 2, 2018, 7 pages.
Notice of Allowance mailed on Mar. 21, 2023, issued in connection with U.S. Appl. No. 17/096,689, filed Nov. 12, 2020, 7 pages.
Notice of Allowance mailed on May 6, 2022, issued in connection with U.S. Appl. No. 17/096,689, filed Nov. 12, 2020, 5 pages.
Palm, Inc., "Handbook for the Palm VII Handheld," May 2000, 311 pages.
Presentations at WinHEC 2000, May 2000, 138 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

\* cited by examiner

SYSTEMS AND METHODS OF VOLUME LIMITING

CROSS-REFERENCE TO RELATED APPLICATIONS

The present application is a continuation of U.S. patent application Ser. No. 17/096,689, filed Nov. 12, 2020, now U.S. Pat. No. 11,716,065, which is a continuation of U.S. application Ser. No. 15/943,064, filed Apr. 2, 2018, now U.S. Pat. No. 10,865,446, each of which is incorporated herein by reference in its entirety.

FIELD OF THE DISCLOSURE

The disclosure is related to consumer goods and, more particularly, to methods, systems, products, features, services, and other elements directed to limiting volume in media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

Figure 1:
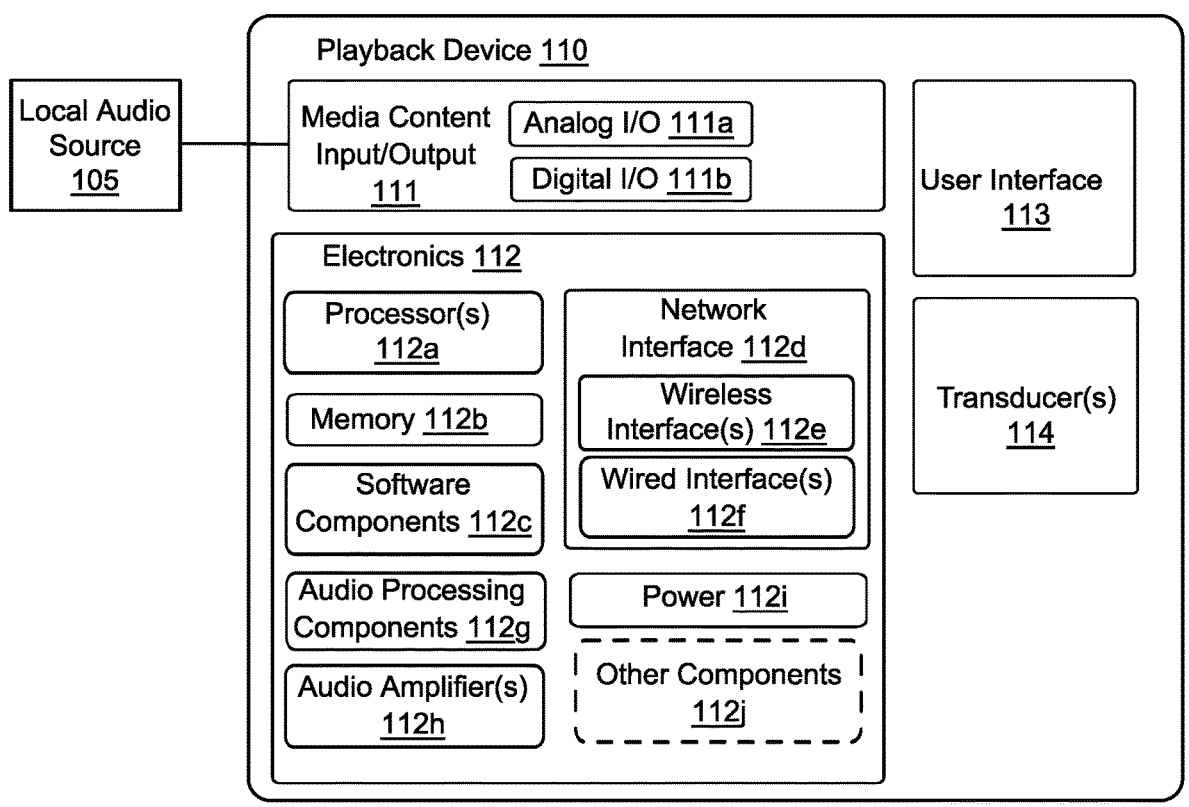
FIG. 1 is a functional block diagram of an example playback device.

The drawings are for purposes of illustrating example embodiments, but it is understood that the inventions are not limited to the arrangements and instrumentality shown in the drawings.

DETAILED DESCRIPTION

I. Overview

A playback device may play audio content at different volume settings. The playback device may have a certain operational limit (e.g., mechanical, electrical, thermal) beyond which audio quality may deteriorate or components of the playback device may become damaged. The operational limit can include, for example, maximum movement of a surround, spider, voice coil, and cone from a rest position when an audio signal is applied to a transducer, as well as voltage limits, current limits, power limits, temperature limits, and any other physical parameters associated with the playback device when playing audio.

To avoid this operational limit, certain playback devices rely on dynamic bass control and/or a limiter. Dynamic bass control reduces the amount of bass in the audio signal when necessary to prevent the playback device from reaching its operational limit. Because bass-heavy signals result in greater energy carried by the transducer, they present greater risk of reaching the operational limit of the playback device. A limiter quickly adjusts its gain for an audio signal that exceeds a predetermined threshold to prevent the playback device from reaching its operational limit. Limiters can be characterized by their time constants, particularly an "attack time" (i.e., the time it takes for the signal to become fully attenuated by the limiter after exceeding the threshold level) and a "release time" (i.e., the time it takes for the signal to return from its attenuated state to its original state after the signal has fallen below the threshold level). Limiters can also have varying shapes of attack and release, for example, either linearly or exponentially attenuating the signal in the attack phase, and either linearly or exponentially reducing attenuation of the signal in the release phase. Varying the time constants of the limiters will vary their performance and associated audible artifacts that arise from controlling a supra-threshold audio signal.

One problem with conventional limiting methods is that they produce a choppy listening experience. For example, in certain bass-heavy content (e.g., acoustic content with high bass levels, such as a kick drum), quieter beats of the kickdrum may be limited less whereas louder beats of the kick drum (which are expected to exceed the transducer's physical limits) may be limited more. The difference in limiting may result in the bass appearing to unnaturally cut in and out. Additionally, in playback devices that incorporate both dynamic bass control and a limiter, the interaction of these two components can result in an undesirable over-limiting of the audio signal. Many playback devices, for example, include an arrangement in which the dynamic bass control is upstream of the limiter in the signal-processing chain. In these arrangements, the dynamic bass control reduces the bass to a level needed to avoid reaching operational limits of the playback device. However, subsequent to this bass reduction, the limiter applies wide-band limiting of supra-threshold signals, thereby further limiting total output to avoid reaching operational limits of the playback device. Because the upstream dynamic bass control does not "know" what attenuation the limiter will apply to the output signal, it can over-limit the audio signal. This results in bass being reduced more than is necessary to maintain desirable bass levels and a safe operating range for the playback device.

Embodiments described herein are directed to a feedback controller that receives a gain reduction value from the limiter and, based on the gain reduction value, provides a feedback signal to an upstream gain stage in the signal processing chain. By providing this feedback from the limiter to an earlier gain stage, the need for bass reduction can be lowered in certain circumstances. The feedback controller can apply separate filters to the gain reduction value from the limiter, each having different time constants. By evaluating the gain reduction value using time constants at varying time scales, and then combining the filter outputs, the controller achieves a balanced overall dynamic gain reduction that minimizes audible artifacts.

The present technology is illustrated, for example, according to various aspects described below. Various examples of aspects of the present technology are described as numbered examples (1, 2, 3, etc.) for convenience. These are provided as examples and do not limit the present technology. It is noted that any of the dependent examples may be combined in any combination, and placed into a respective independent example. The other examples can be presented in a similar manner.

Example 1. A method, comprising:
receiving a first audio signal at a gain stage;
receiving a feedback signal from a controller at the gain stage;
based at least in part on the feedback signal from the controller, modulating a gain of the first audio signal via the gain stage to provide a second audio signal;
receiving the second audio signal at a limiter;
limiting the second audio signal via the limiter to produce an output signal;
providing a gain reduction value from the limiter to the controller;
based on the gain reduction value from the limiter, determining the feedback signal via the controller; and
playing back audio based on the output signal.

Example 2. The method of example 1, wherein the controller comprises a plurality of time constant (TC) filters, and wherein determining the feedback signal comprises applying each of the TC filters to the gain reduction value from the limiter.

Example 3. The method of example 2, wherein determining the feedback signal further comprises applying the filters to the gain reduction value from the limiter in parallel and combining TC filter output signals.

Example 4. The method of example 3, further comprising range-limiting the TC filter output signals before combining the TC filter output signals to determine the feedback signal.

Example 5. The method of any one of examples 2-4, wherein each of the TC filters comprises different time constants.

Example 6. The method of any one of examples 2-5, wherein the TC filters comprise:
a first TC filter having a first attack time and a first release time;
a second TC filter having a second attack time and a second release time; and
a third TC filter having a third attack time and a third release time.

Example 7. The method of example 6, wherein the first attack time is less than the second attack time, and wherein the second attack time is less than the third attack time.

Example 8. The method of any one of examples 6-7, wherein the first release time is less than the second release time, and wherein the second release time is less than the third release time.

Example 9. The method of any one of examples 6-8, wherein the first attack time is between about 0 ms and about 20 ms, and wherein the first release time is between about 0 ms and about 20 ms.

Example 10. The method of any one of examples 6-9, wherein the second attack time is between about 20 ms and about 100 ms, and wherein the second release time is between about 100 ms and about 300 ms.

Example 11. The method of any one of examples 6-10, wherein the third attack time is between about 250 ms and about 1000 ms, and wherein the third release time is between about 1000 ms and about 3000 ms.

Example 12. The method of any one of examples 6-11, wherein the second TC filter has exponential release and wherein the third TC filter has linear release.

Example 13. The method of any one of examples 2-12, wherein the TC filters comprise:
a fast filter configured to suppress supra-threshold signals on a first timescale;
an intermediate filter configured to suppress supra-threshold signals on a second timescale; and
a slow filter configured to suppress supra-threshold signals on a third timescale,
wherein the first timescale is less than the second timescale, and wherein the second timescale is less than the third timescale.

Example 14. The method of any one of examples 2-13, further comprising applying a scaling factor to the gain reduction value before applying at least one of the TC filters.

Example 15. The method of any one of examples 2-12, further comprising biasing the gain reduction value before applying the TC filters.

Example 16. The method of any one of examples 1-15, wherein providing the gain reduction value from the limiter to the controller comprises determining an amount of gain reduction applied by the limiter to the second audio signal.

Example 17. The method of any one of examples 1-16, further comprising, before delivering the second audio stage to the limiter, delivering the second audio to a dynamic bass control.

Example 18. A non-transitory computer-readable medium comprising instructions for limiting volume in audio playback, the instructions, when executed by a processor, causing the processor to perform the following:
receiving a first audio signal at a gain stage;
receiving a feedback signal from a controller at the gain stage;
based at least in part on the feedback signal from the controller, modulating a gain of the first audio signal via the gain stage to provide a second audio signal;
delivering the second audio signal to a limiter;
limiting the second audio signal via the limiter to produce an output signal;
providing a gain reduction value from the limiter to the controller;
based on the gain reduction value from the limiter, determining the feedback signal via the controller; and
playing back audio based on the output signal.

Example 19. The non-transitory computer-readable medium of example 18, wherein the controller comprises a plurality of time constant (TC) filters and wherein determining the feedback signal comprises applying each of the TC filters to the gain reduction value from the limiter.

Example 20. The non-transitory computer-readable medium of example 19, wherein determining the feedback signal comprises applying the filters to the gain reduction value from the limiter in parallel and combining TC filter output signals.

Example 21. The non-transitory computer-readable medium of example 20, further comprising range-limiting the TC filter output signals before combining the TC filter output signals to determine the feedback signal.

Example 22. The non-transitory computer-readable medium of any one of examples 19-21, wherein each of the TC filters comprises different time constants.

Example 23. The non-transitory computer-readable medium of any one of examples 19-22, wherein the TC filters comprise:
- a first TC filter having a first attack time and a first release time;
- a second TC filter having a second attack time and a second release time; and
- a third TC filter having a third attack time and a third release time.

Example 24. The non-transitory computer-readable medium of example 23, wherein the first attack time is less than the second attack time, and wherein the second attack time is less than the third attack time.

Example 25. The non-transitory computer-readable medium of any one of examples 23-24, wherein the first release time is less than the second release time, and wherein the second release time is less than the third release time.

Example 26. The non-transitory computer-readable medium of any one of examples 23-25, wherein the first attack time is between about 0 ms and about 20 ms, and wherein the first release time is between about 0 ms and about 20 ms.

Example 27. The non-transitory computer-readable medium of any one of examples 23-26, wherein the second attack time is between about 20 ms and about 100 ms, and wherein the second release time is between about 100 ms and about 300 ms.

Example 28. The non-transitory computer-readable medium of any one of examples 23-27, wherein the third attack time is between about 250 ms and about 1000 ms, and wherein the third release time is between about 1000 ms and about 3000 ms.

Example 29. The non-transitory computer-readable medium of any one of examples 23-28, wherein the second TC filter has exponential release and wherein the third TC filter has linear release.

Example 30. The non-transitory computer-readable medium of any one of examples 19-29, wherein the TC filters comprise:
- a fast filter configured to suppress supra-threshold signals on a first timescale;
- an intermediate filter configured to suppress supra-threshold signals on a second timescale; and
- a slow filter configured to suppress excess supra-threshold signals on a third timescale,
- wherein the first timescale is less than the second timescale, and wherein the second timescale is less than the third timescale.

Example 31. The non-transitory computer-readable medium of any one of examples 19-30, further comprising applying a scaling factor to the gain reduction value before applying at least one of the TC filters.

Example 32. The non-transitory computer-readable medium of any one of examples 19-31, further comprising biasing the gain reduction value before applying the TC filters.

Example 33. The non-transitory computer-readable medium of any one of examples 18-32, wherein providing the gain reduction value from the limiter to the controller comprises determining an amount of gain reduction applied by the limiter to the second audio signal.

Example 34. The non-transitory computer-readable medium of any one of examples 18-33, further comprising, before delivering the second audio stage to the limiter, delivering the second audio to a dynamic bass filter.

Example 35. An audio signal processing system of a playback device, the system comprising:
- a gain stage configured to receive an audio signal and modulate the gain;
- a limiter downstream of the gain stage configured to apply gain reduction to signals above a predetermined threshold; and
- a feedback controller configured to receive a gain reduction value from the limiter and provide a feedback signal to the gain stage to adjust the gain modulation applied by the gain stage.

Example 36. The system of example 35, wherein the feedback controller is configured to bias the gain reduction value received from the limiter by a predetermined bias amount.

Example 37. The system of example 36, wherein the feedback controller is configured to apply an algorithm to the biased gain reduction value and outputs the feedback signal to the gain stage.

Example 38. The system of example 37, wherein applying the algorithm comprises applying a plurality of time constant (TC) filters to the biased gain reduction value and combining TC filter output signals.

Example 39. The system of example 38, wherein each of the TC filters comprises different time constants.

Example 40. The system of example 39, wherein the TC filters comprise:
- a first TC filter having a first attack time and a first release time;
- a second TC filter having a second attack time and a second release time; and
- a third TC filter having a third attack time and a third release time.

Example 41. The system of example 40, wherein the first attack time is less than the second attack time, and wherein the second attack time is less than the third attack time.

Example 42. The system of any one of examples 40-41, wherein the first release time is less than the second release time, and wherein the second release time is less than the third release time.

Example 43. The system of any one of examples 40-42, wherein the first attack time is between about 0 ms and about 20 ms, and wherein the first release time is between about 0 ms and about 20 ms.

Example 44. The system of any one of examples 40-43, wherein the second attack time is between about 20 ms and about 100 ms, and wherein the second release time is between about 100 ms and about 300 ms.

Example 45. The system of any one of examples 40-44, wherein the third attack time is between about 250 ms and about 1000 ms, and wherein the third release time is between about 1000 ms and about 3000 ms.

Example 46. The system of any one of examples 40-45, wherein the second TC filter has exponential release and wherein the third TC filter has linear release.

Example 47. The system of any one of examples 38-47, wherein the TC filters comprise:
- a fast filter configured to suppress supra-threshold signals on a first timescale;
- an intermediate filter configured to suppress supra-threshold signals on a second timescale; and
- a slow filter configured to suppress supra-threshold signals on a third timescale,
- wherein the first timescale is less than the second timescale, and wherein the second timescale is less than the third timescale.

Example 48. The system of any one of examples 35-47, further comprising a dynamic bass filter disposed between the gain stage and the limiter.

While some embodiments described herein may refer to functions performed by given actors such as "users" and/or other entities, it should be understood that this description is for purposes of explanation only. The examples should not be interpreted to require action by any such example actor unless explicitly required by the language of the claims themselves.

Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Example Playback Devices

FIG. 1 is a block diagram of an example playback device 110. As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

The playback device 110 comprises an input/output 111, which can include an analog I/O 111a (e.g., one or more wires, cables, and/or other suitable communication links configured to carry analog signals) and/or a digital I/O 111b (e.g., one or more wires, cables, or other suitable communication links configured to carry digital signals). In some embodiments, the analog I/O 111a is an audio line-in input connection comprising, for example, an auto-detecting 3.5 mm audio line-in connection. In some embodiments, the digital I/O 111b comprises a Sony/Philips Digital Interface Format (S/PDIF) communication interface and/or cable and/or a Toshiba Link (TOSLINK) cable. In some embodiments, the digital I/O 111b comprises an High-Definition Multimedia Interface (HDMI) interface and/or cable. In some embodiments, the digital I/O 111b includes one or more wireless communication links comprising, for example, a radio frequency (RF), infrared, WiFi, Bluetooth, or another suitable communication protocol. In certain embodiments, the analog I/O 111a and the digital 111b comprise interfaces (e.g., ports, plugs, jacks) configured to receive connectors of cables transmitting analog and digital signals, respectively, without necessarily including cables.

The playback device 110, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110 comprise the local audio source 105. In other embodiments, however, the media playback system omits the local audio source altogether. In some embodiments, the playback device 110 does not include an input/output 111 and receives all audio content via the network.

The playback device 110 further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, amplify the received audio, and output the amplified audio for playback via one or more of the transducers 114. In some embodiments, the playback device 110 optionally includes one or more microphones (e.g., a single microphone, a plurality of microphones, a microphone array). In certain embodiments, for example, the playback device 110 having one or more of the optional microphones can operate as a networked microphone device (NMD) configured to receive voice input from a user and correspondingly perform one or more operations based on the received voice input. In the illustrated embodiment of FIG. 1, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110 to retrieve audio data from an audio source and/or another playback device. In some embodiments, the operations further include causing the playback device 110 to send audio data to another playback device and/or another device. Certain embodiments include operations causing the playback device 110 to pair with another of the one or more playback devices to enable a multi-channel audio environment (e.g., a stereo pair, a bonded zone).

The processors 112a can be further configured to perform operations causing the playback device 110 to synchronize playback of audio content with another playback device. As those of ordinary skill in the art will appreciate, during synchronous playback of audio content on a plurality of playback devices, a listener will preferably be unable to perceive time-delay differences between playback of the audio content by the playback device 110 and the other playback device. Additional details regarding audio playback synchronization among playback devices can be found, for example, in U.S. Pat. No. 8,234,395, which is hereby incorporated by reference in its entirety.

In some embodiments, the memory 112b is further configured to store data associated with the playback device 110, such as one or more zones and/or zone groups of which the playback device 110 is a member, audio sources accessible to the playback device 110, and/or a playback queue that the playback device 110 (and/or another one or more playback devices) can be associated with. The stored data can comprise one or more state variables that are periodically updated and used to describe a state of the playback device 110. The memory 112b can also include data associated with a state of one or more of other devices (e.g., another playback device, a control device, etc.). In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110 and one or more other devices on a data network. The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110.

In the illustrated embodiment of FIG. 1, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices that are communicatively coupled to the network in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, a USB-C, and/or a Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

By way of illustration, SONOS, Inc. presently offers (or has offered) for sale certain playback devices including, for example, a "SONOS ONE," "PLAY:1," "PLAY:3," "PLAY: 5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skill in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers.

Figure 2A:
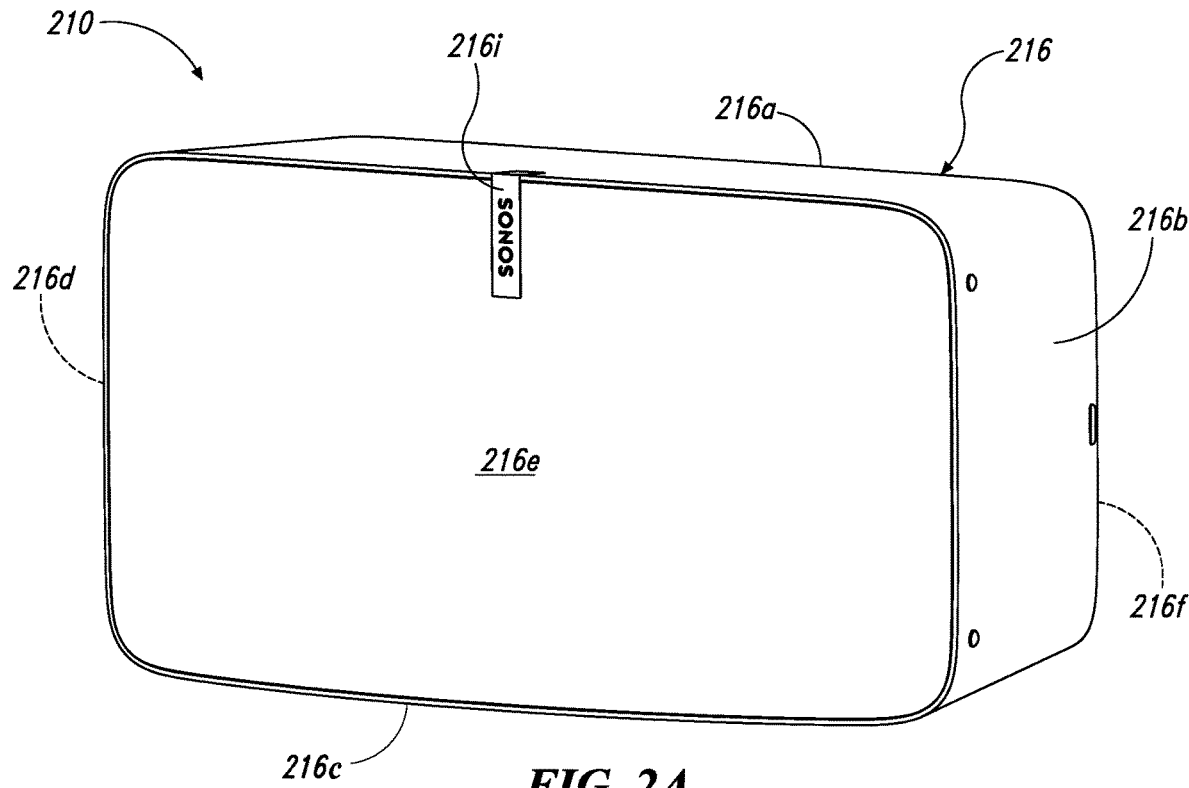
FIG. 2A is a front isometric view of a playback device configured in accordance with aspects of the disclosed technology.
Figure 2B:
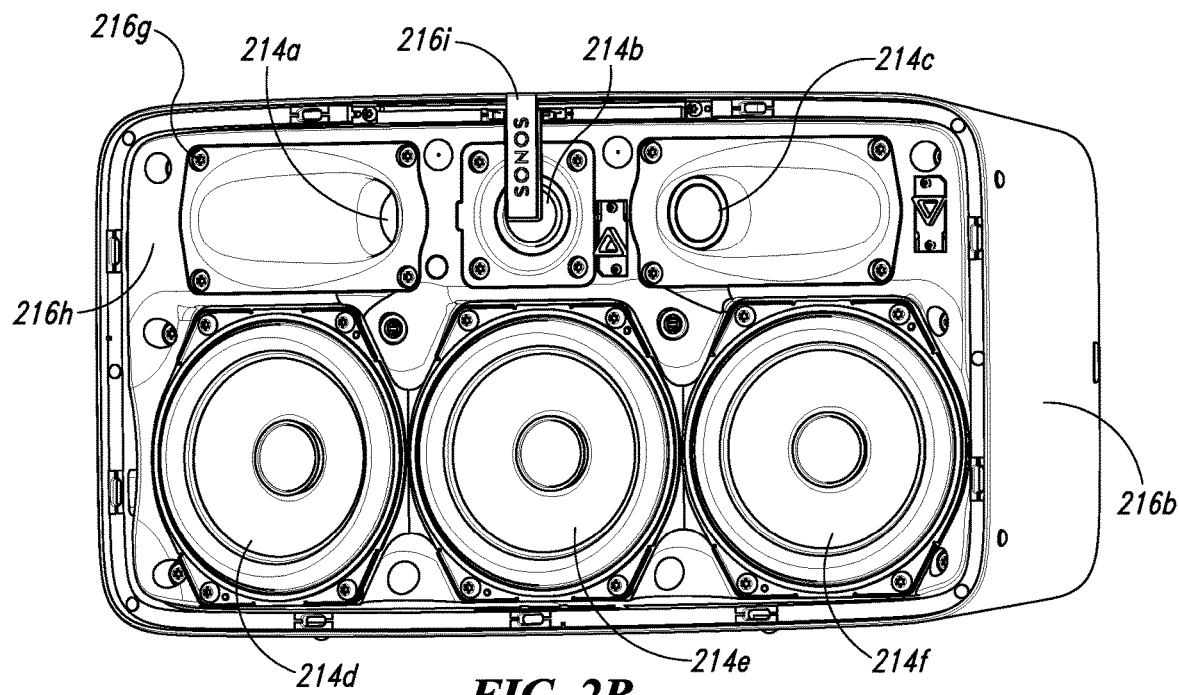
FIG. 2B is a front isometric view of the playback device of FIG. 2A without a grille.
Figure 2C:
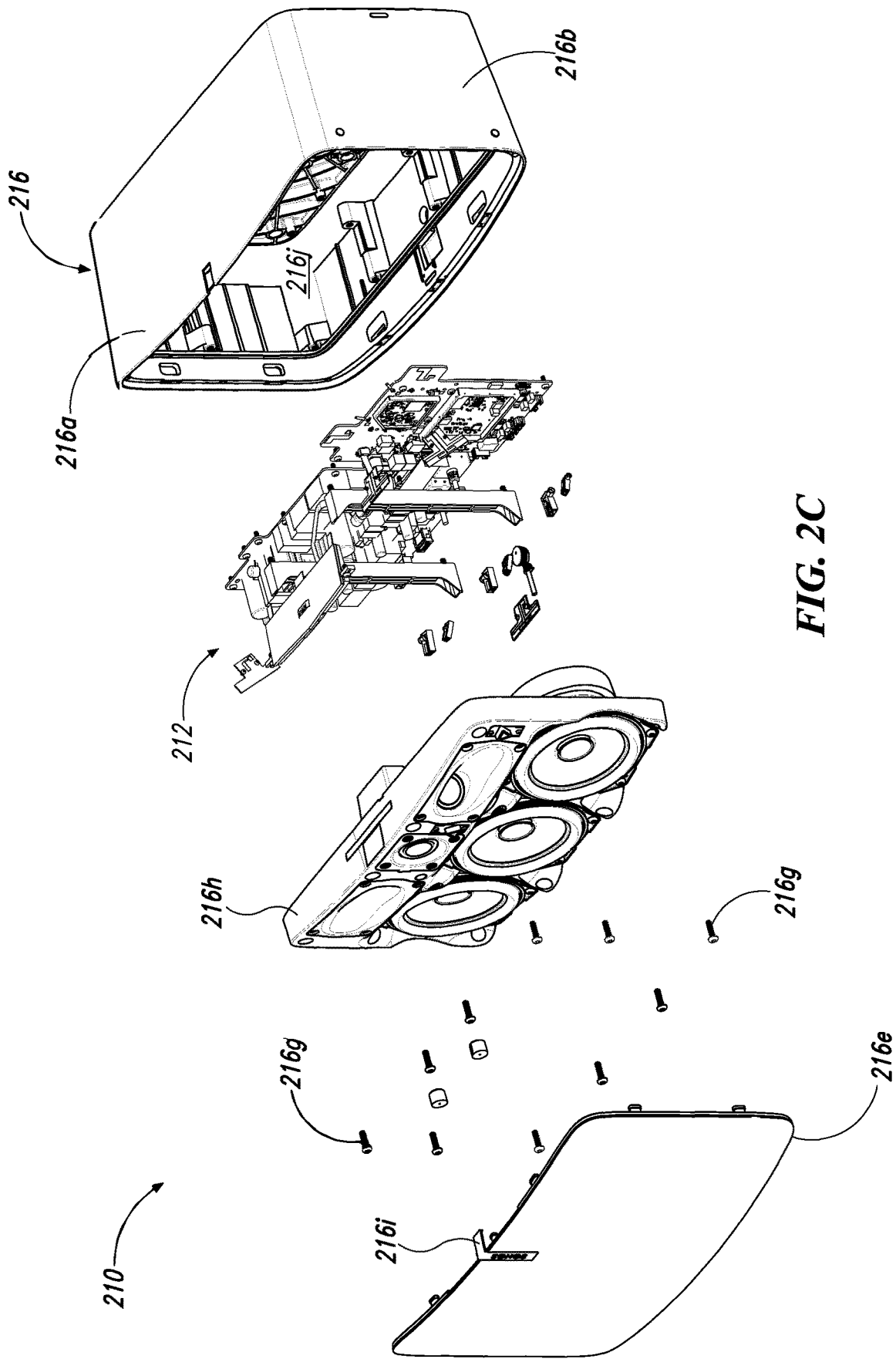
FIG. 2C is an exploded isometric view of the playback device of FIG. 2A.

FIG. 2A is a front isometric view of a playback device 210 configured in accordance with aspects of the disclosed technology. FIG. 2B is a front isometric view of the playback device 210 without a grille 216e. FIG. 2C is an exploded view of the playback device 210. Referring to FIGS. 2A-2C together, the playback device 210 comprises a housing 216 that includes an upper portion 216a, a right or first side portion 216b, a lower portion 216c, a left or second side portion 216d, the grille 216e, and a rear portion 216f. A plurality of fasteners 216g (e.g., one or more screws, rivets, clips) attaches a frame 216h to the housing 216. A cavity 216j (FIG. 2C) in the housing 216 is configured to receive the frame 216h and electronics 212. The frame 216h is configured to carry a plurality of transducers 214 (identified individually in FIG. 2B as transducers 214a-f). The electronics 212 (e.g., the electronics 112 of FIG. 1) are configured to receive audio content from an audio source and send electrical signals corresponding to the audio content to the transducers 214 for playback.

The transducers 214 are configured to receive the electrical signals from the electronics 112, and further configured to convert the received electrical signals into audible sound during playback. For instance, the transducers 214a-c (e.g., tweeters) can be configured to output high frequency sound (e.g., sound waves having a frequency greater than about 2 kHz). The transducers 214d-f (e.g., mid-woofers, woofers, midrange speakers) can be configured output sound at frequencies lower than the transducers 214a-c (e.g., sound waves having a frequency lower than about 2 kHz). In some embodiments, the playback device 210 includes a number of transducers different than those illustrated in FIGS. 2A-2C. For example, the playback device 210 can include fewer than six transducers (e.g., one, two, three). In other embodiments, however, the playback device 210 includes more than six transducers (e.g., nine, ten). Moreover, in some embodiments, all or a portion of the transducers 214 are configured to operate as a phased array to desirably adjust (e.g., narrow or widen) a radiation pattern of the transducers 214, thereby altering a user's perception of the sound emitted from the playback device 210.

In the illustrated embodiment of FIGS. 2A-2C, a filter 216i is axially aligned with the transducer 214b. The filter 216i can be configured to desirably attenuate a predetermined range of frequencies that the transducer 214b outputs to improve sound quality and a perceived sound stage output collectively by the transducers 214. In some embodiments, however, the playback device 210 omits the filter 216i. In other embodiments, the playback device 210 includes one or more additional filters aligned with the transducers 214b and/or at least another of the transducers 214.

III. Example Systems and Methods for Limiting Volume in a Playback Device

Figure 3A:
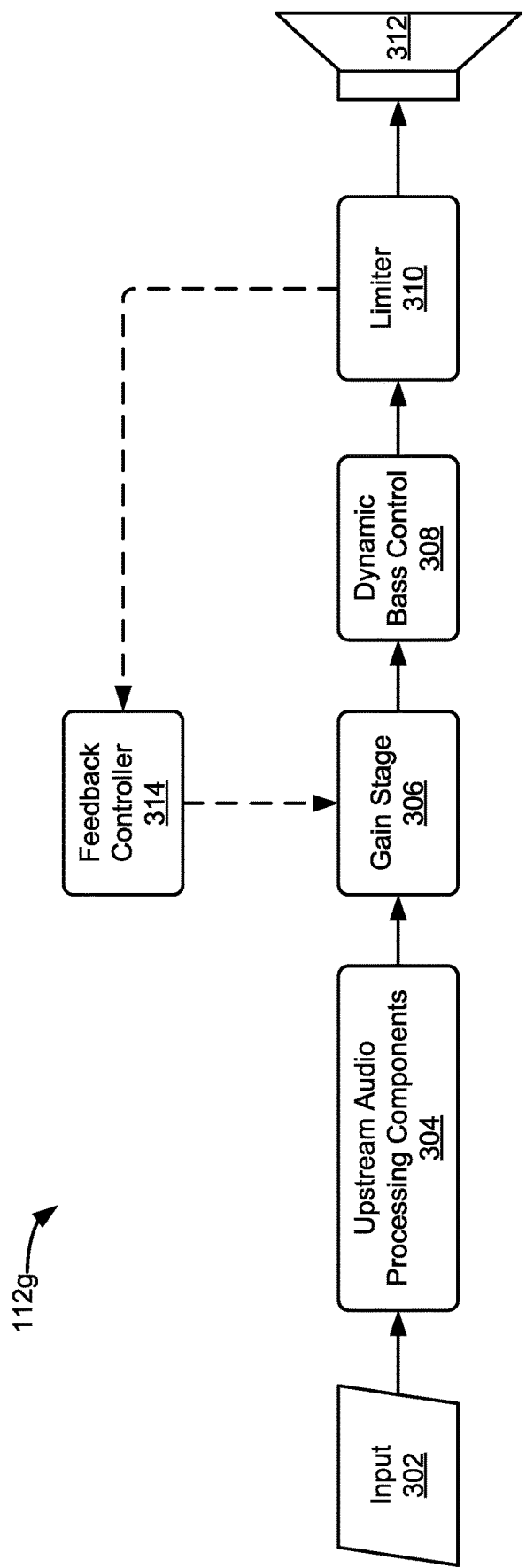
FIG. 3A is a block diagram of audio processing components in accordance with aspects of the present technology.

FIG. 3A illustrates a functional block diagram of the audio processing components 112g shown in FIG. 1. The audio processing components 112g can be a part of the processor 112a (FIG. 1), or in some embodiments they can be physically separate components, such as analog electronic components or separate electronic components configured to carry out particular audio processing operations. The components 112g receive an input 302 and include upstream audio processing components 304, a gain stage 306, a dynamic bass control 308, a limiter 310, a transducer 312, and a feedback controller 314. The components are also in communication with a transducer 312, which can be, for example, a speaker or group of speakers. The path of the audio signal is shown in solid lines (passing from the input 302, to upstream audio components 304, to the gain stage 306, to the dynamic bass control 308, to the limiter 310, and to the transducer 312). The path of the control signal for the feedback loop is shown in broken lines (passing from the limiter 310, to the feedback controller 314, and to the gain stage 306).

The input signal 302 can be media content (e.g., audio content comprising music and/or other sounds) from a local or networked audio source. In one example, the audio signal may be a digital audio signal such as a packetized or non-packetized stream of audio from a music service or television, a digital audio file, an audio signal generated by the playback device itself or a device connected to the audio playback device. For example, the packet may comprise 128 bits of audio data. In another example, the audio signal may be an analog signal input from an auxiliary connection or a digital signal input from a USB connection. The audio signal may comprise frequency content that may range from 0 Hz to 22,050 Hz or some subset of this frequency range.

The upstream audio processing components 304 can take a variety of forms, for example, a decoder (e.g., Dolby, MP3, etc.), an analog-to-digital converter (ADC), a user-adjusted volume control, user-adjusted treble and bass settings, an equalizer, array processing to accommodate additional playback devices, etc. In some embodiments, any number of additional upstream audio processing components 304 can be included between the input 302 and the gain stage 306 without materially affecting operation of the downstream components.

The gain stage 306 modulates the gain of the audio signal received from the upstream audio processing components 304 and passes the gain-modulated signal to the dynamic bass control 308. The gain stage 306 can be positioned at any point upstream of the dynamic bass control 308 and the limiter 310. The gain stage 306 can be any portion of the audio processing chain within the playback device 110 (FIG. 1) at which the level of the audio signal is amplified or attenuated before reaching the dynamic bass control 308 and the limiter 310.

The dynamic bass control 308 can reduce the amount of bass in the signal received from the gain stage 306 to avoid operational limits of the playback device 110. For example, in some embodiments, the dynamic bass control 308 can include a dynamic high-pass filter that eliminates or attenuates certain low-frequency signals to maintain the playback device 110 within its operational limits. As noted previously, in operation this attenuation of low-frequency signals can reduce the need for the limiter 310 to reduce the gain of the audio signal. In some embodiments, additional processing components can be included between the gain stage 306 and the dynamic bass control 308, so long as the gain stage 306 is upstream of the dynamic bass control 308.

The limiter 310 can include various analog electrical components (e.g., capacitors, resistors, inductors) or digital filters that prevent the audio signal from exceeding a defined threshold. The limiter 310 attenuates an amplitude of the audio signal at one or more frequencies so that the audio playback device continues to operate within its operational limit. The amount that the audio signal is reduced by the limiter at any given moment is referred to herein as the "gain reduction" applied by the limiter. For example, if the limiter 310 received an audio signal at 3 dB and output an audio signal to the transducer 312 at 2 dB, then the gain reduction of the limiter 310 at that moment is 1 dB. As audio signals are typically dynamic, the amount of gain reduction applied by the limiter 310 will generally vary over time. The gain reduction value applied by the limiter 310 can be detected and provided to the feedback controller 314 as reflected in the dashed line of FIG. 3A.

Between the limiter 310 and the transducer 312, additional audio processing components can be included. For example, the audio processing components may include crossover circuits and electronic filter circuitry. The crossover circuitry may be electronic filter circuitry used in a range of audio applications to split up an audio signal into two or more frequency ranges, so that the signals can be sent to drivers or tweeters that are designed for different frequency ranges. In some embodiments, the additional components can include an audio amplifier to perform equalization, a digital-to-analog convert (DAC), or other suitable components. In this regard, the operational limit of the playback device may include electrical limits, mechanical limits, thermal limits, and/or other physical limits associated with functionality of the processing components between the limiter 310 and the transducer 312. For example, there may be voltage and/or current limits associated with the circuitry in the audio playback pipeline such as analog or digital filters. There may also be temperature limits associated with the circuitry. Accordingly, the limiter 310 may reduce the gain of the audio signal by a sufficient amount to protect these downstream components from damage caused by exceeding operational limits.

The feedback controller 314 receives a gain reduction value from the limiter 310 and provides a feedback control signal to the gain stage 306. In some embodiments, if the limiter 310 is delivering high levels of gain reduction (indicating that the signal would otherwise cause the playback device 110 to exceed its operational limits), the feedback controller 314 provides a feedback control signal to the gain stage 306 that causes the gain stage 306 to reduce the gain of the incoming audio signal. This reduction in gain will in turn reduce the amount of gain-reduction necessary at the limiter 310 to maintain the playback device 110 within its operational limits. Conversely, if the limiter 310 is delivering little or no gain reduction (indicating that the signal is not causing the playback device 110 to approach its operational limits), the feedback controller 314 can provide a feedback control signal to the gain stage 306 that causes the gain stage 306 to increase the gain of the incoming audio signal. This feedback loop enables dynamic modulation of the gain applied via the gain stage 306 to ensure that the limiter 310 does not over-limit the signal (which could result in audible artifacts) while also ensuring that the gain is not excessively reduced. As noted above, in systems without a feedback controller 314, the dynamic bass control 308 is applied before the limiter 310. As a result, in some cases without a feedback controller, because the limiter 310 lowers the amplitude of the signal across a wide frequency band subsequent to operation of the dynamic bass control 308, the dynamic bass control 308 attenuates the bass components of the audio signal more than would be necessary to prevent damage to the playback device 110. By incorporating the feedback controller 314, the upstream gain stage 306 can tune the gain of the audio signal to maintain the playback device 110 within operational limits without sacrificing performance by, for example, excessively reducing bass components of the audio signal.

In some embodiments, the feedback controller 314 can include one or more filters configured to process the gain reduction value received from the limiter 310 and provide a feedback signal to the gain stage 306 that causes the gain stage 306 to increase, decrease, or to maintain its previous value. The filters can include one or more time constant (TC) filters characterized by different time constants (i.e., attack and release times). These filters can be configured to operate separately on the gain reduction value received from the limiter 310, and their outputs can be combined or merged to provide the feedback signal to the gain stage 306. In some embodiments, the number of TC filters included in the controller 314 can be two or more, three or more, four or more, etc. In some embodiments, the feedback controller 314 applies two or more TC filters to the gain reduction value in parallel. In at least some embodiments, the feedback controller 314 applies two or more TC filters to the gain reduction parallel in series.

Figure 3B:
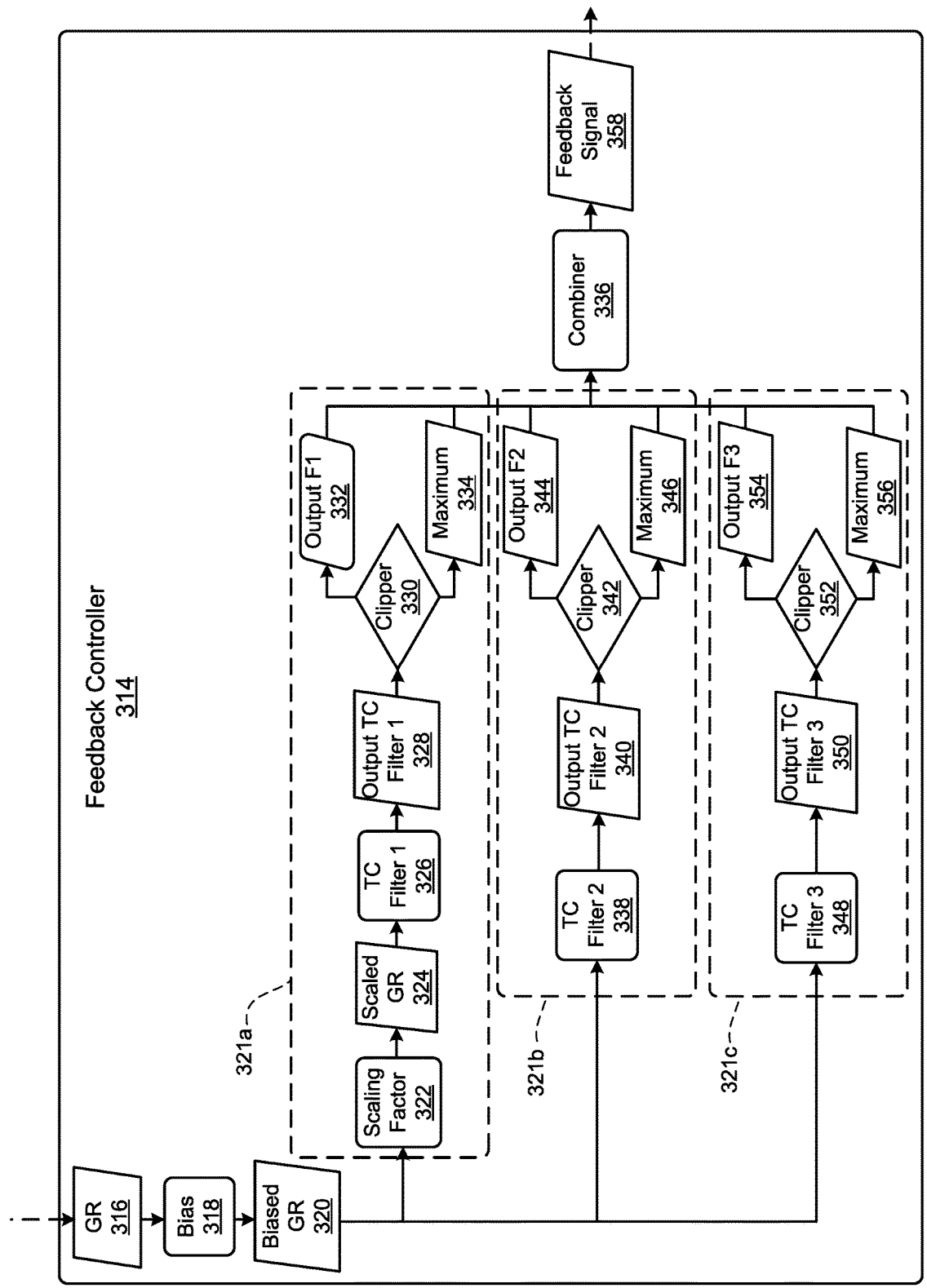
FIG. 3B is a functional block diagram of an example feedback controller as shown in FIG. 3A.

FIG. 3B is a functional block diagram of one example of the feedback controller 314 shown in FIG. 3A. As noted above, the feedback controller 314 receives a gain reduction (GR) 316 from the limiter 310. The GR 316 reflects the amount that the amplitude was reduced at the limiter 310 to maintain the playback device 110 within operational limits. This value can be expressed either positively or negatively (e.g., either 1 dB or −1 dB to indicate a gain reduction with a magnitude of 1 dB), with subsequent processing operations accounting for the selected orientation. The following examples refer to the gain reduction value in the positive, such that a value for GR 316 of 1 dB indicates that the limiter 310 has reduced the gain of the input signal by 1 dB. Additionally, although many of the following examples express values and operations in terms of dB (and therefore on a logarithmic scale), this description is intended to encompass equivalent operations that might be carried on a linear scale with absolute values.

The feedback controller 314 applies a bias 318 to the GR 316 to produce the biased GR 320. The bias 318 is a value by which the feedback controller 314 offsets the GR 316 received from the limiter 310. For example, with a −1 dB bias, a GR 316 value from the limiter 310 of 1 dB would result in a biased GR 316 of 0 dB. Similarly, with a −1 dB bias, a GR value from the limiter 310 of 2 dB would result in a biased GR of 1 dB. The value of the bias 318 drives the overall behavior of the feedback controller 314, as this determines how much gain reduction performed by the limiter 310 is "too much" such that the feedback signal causes the gain stage 306 to reduce the gain. The bias 318 likewise determines how little gain reduction performed by the limiter 310 is "too little" such that the feedback signal causes the gain stage 306 to increase the gain. In various embodiments, the bias value can be between about 0 dB and 3 dB, or between about 0.5 dB and about 2 dB, or in some embodiments about 1 dB.

The biased GR 320 proceeds to three separate processing pathways 321a-c that can proceed in parallel: a first pathway 321a, a second pathway 321b, and a third pathway 321c. As described in more detail below, each of these pathways 321a-c can include a time constant (TC) filter that has different time constants and is configured to respond to time-varying signals with different temporal dynamics. For example, these three pathways 321a-c can, in some embodiments, include first, second, and third TC filters 326, 338, and 348, respectively. The feedback controller 314 combines the outputs of these three pathways 321a-c to produce a feedback signal that eventually reaches the gain stage 306. In some embodiments, two or more of the TC filters can have the same, similar, or overlapping time constants. Although the illustrated embodiment of FIG. 3B includes three separate processing pathways 321a-c, in some embodiments there may be a different suitable number of pathways (e.g., two pathways, four pathways, five pathways, or more), each having at least one corresponding TC filter.

The feedback controller 314 passes the biased GR 320 to the first processing pathway 321a, which begins by applying a scaling factor 322. The scaling factor 322 reduces the biased GR 320 by a predetermined amount. This can be, for example, a reduction on a logarithmic scale of 50%, for example, reducing a biased GR 320 of 3 dB to 1.5 dB. In other embodiments, the scalar reduction can be between about 25% and about 75%, between about 40% and about 60%, and/or approximately 50%. In other embodiments, the scaling factor 322 can be omitted altogether. By introducing a scaling factor 322, the relative contribution of the first TC filter 326 can be reduced relative to the other two TC filters. This can prevent the first TC filter 326 from dominating the operation of the feedback controller 314. In some embodiments, one or more of the additional processing pathways 321b-c can also include a scaling factor having the same or different associated scaling values as that of scaling factor 322.

The feedback controller 314 passes the scaled GR 324 to the first TC filter 326. The first TC filter 326 can have an associated predefined attack and release time. In some embodiments, the first TC filter 326 is a relatively fast filter, for example having relatively short attack and release times. The attack time of the first TC filter 326 can be between about 0 ms and about 20 ms, and the release time can be between about 0 ms and about 20 ms.

The feedback controller 314 provides the output 328 from the first TC filter 326 to a range-limiter or clipper 330. At the clipper 330, if the output 328 is less than a predetermined threshold, the output 328 is passed through without modification. If, however, the output 328 exceeds a predetermined threshold, then the feedback controller 314 reduces the output 328 to the threshold and output as maximum 334. Because the clipper 330 only "clips" the signal if it exceeds the threshold, it is also referred to herein as a "range limiter" and its function referred to as "range-limiting." For example, if the output 328 from the first TC filter 326 in one block is 5 dB, and the predetermined threshold for the clipper 330 is 4 dB of gain reduction, then the clipper 330 will output a value of 4 dB as the maximum 334. If instead the output 328 from the first TC filter 326 is 3 dB and again the predetermined threshold for the clipper 330 is 4 dB, then the clipper 330 will output the 3 dB value as the output 332. In either case, the feedback controller 314 provides the output (either output 332 or maximum 334) to a combiner 336 where the output is combined with those of the other two processing pathways 321b-c discussed below. In various embodiments, the threshold of the clipper 330 can be, for example, between about 1 dB and about 10 dB, or between about 2 dB and about 6 dB, or about 4 dB.

The second processing pathway 321b to which the biased GR 320 is passed begins with a second time constant (TC) filter 338. As noted above, in some embodiments an additional scaling factor is disposed between the biased GR 320 and the second TC filter 338. The second TC filter 338 can have attack and release times that differ from those of the first TC filter 326. For example, in some embodiments the second TC filter 338 is an "intermediate" TC filter as compared to the "fast" first TC filter 326, meaning that the second TC filter 338 has longer attack and/or release times than the first TC filter 326. In some embodiments, the attack time of the second TC filter 338 is between about 20 ms and about 100 ms, and the release time of the second TC filter 338 is between about 100 ms and about 300 ms. The shape of the attack and/or release of the second TC filter 338 can be exponential (as shown on a logarithmic scale). In some embodiments, the shape of the attack and/or release of the second TC filter 338 can take other forms, for example linear.

The feedback controller 314 then provides the output 340 from the second TC filter 338 to a clipper 342, which can operate similar to the clipper 330 discussed above to limit the range of the output 340. At the clipper 342, if the output 340 is less than a predetermined threshold, the output 340 passes through without modification as output 344. If, however, the output 340 exceeds a predetermined threshold, then the feedback controller 314 reduces the output 340 to the threshold and output as maximum 346. In various embodiments, the threshold of the clipper 342 can be, for example, between about 1 dB and about 10 dB, or between about 2 dB and about 6 dB, or about 4 dB. From the clipper 342, either output 344 or maximum 346 is provided to the combiner 336 at which the output is combined with those of the other two processing pathways 321a and 321c.

The third processing pathway 321c to which the biased GR 320 is passed begins with a second third TC filter 338. As with the second processing pathway 321b, although there is no intervening scaling factor shown in FIG. 3B, in some embodiments the biased GR 320 is scaled or otherwise reduced before being applied to the third TC filter 348. The third TC filter 348 can have attack and release times that are different from the first TC filter 326 and the second TC filter 338. For example, in some embodiments the third TC filter 348 is a "slow" TC filter as compared to the "fast" first TC filter 326 and the "intermediate" second TC filter 338, meaning that the third TC filter 348 has attack and release times that are longer than the attack and release times of the first TC filter 326 and the second TC filter 338. The attack time of the third TC filter 348 can be between about 250 ms and about 1000 ms, and the release time can be between about 1000 ms and about 3000 ms. In some embodiments, the shape of the attack and/or release of the third TC filter 348 is linear (as seen on logarithmic scale). In other embodiments, the shape of the attack and/or release of the third TC filter 348 can take other forms, for example, exponential.

The feedback controller 314 passes the output 350 from the third TC filter 348 to a clipper 352, which can operate similar to the clippers 330 and 342 discussed above, to limit the range of the output 350. At the clipper 352, if the output 350 is less than a predetermined threshold, the output 350 passes through without modification as output 354. If, however, the output 350 exceeds the predetermined threshold, then the output 350 is reduced to the threshold and output as a maximum 356. In various embodiments, the threshold of the clipper 352 can be, for example, between about 1 dB and about 10 dB, or between about 2 dB and about 6 dB, or about 4 dB. In some embodiments, one or more of the clippers 330, 342, and 352 can have the same or similar threshold values, while in other embodiments one or more of the respective threshold values can vary. From the clipper 352, either the output 354 or the maximum 356 is provided to the combiner 336 at which the output is combined with those of the other two processing pathways 321a-b.

The combiner 336 receives outputs from each of the three processing pathways 321a-c as described above. These outputs can be suitably combined in any number of ways. For example, they can be simply added together (in logarithmic scale, equivalent to multiplying together in linear scale) to produce a feedback signal 358. For example, if output 332 is 3 dB, output 344 is 2 dB, and output 354 is 1 dB, then the combiner 336 can add these values together and provide a feedback signal of 6 dB (3+2+1). In other embodiments, one or more weighting factors can be applied to the different outputs such that they are not all given equal predominance in producing the feedback signal 358.

The feedback controller 314 then delivers the feedback signal 358 to the gain stage 306. In some embodiments, an additional TC filter can be provided between the combiner 336 and the gain stage 306 such that the feedback signal 358 is subjected to an additional smoothing operation before reaching the gain stage 306. Based at least in part on the feedback signal 358, the gain stage 306 either increase, decreases, or maintains the amount of gain applied to the incoming audio signal. For example (setting aside the effect of an intervening TC filter between the combiner 336 and the gain stage 306), if the combiner 336 outputs a feedback signal 358 of 6 dB, the gain stage 306 can reduce the amount of gain applied to the incoming audio signal by 6 dB from the previous gain being applied. This will tend to lower the amount of gain reduction that needs to be applied at the limiter 310. Once the amount of gain reduction at the limiter falls (for example below the amount of the bias 318), the feedback signal 358 will tend to fall and even reverse, thereby causing the gain stage 306 to reduce the amount of gain by less, or even increase the amount of gain applied to the incoming audio signal. As a result of this feedback loop, the amount of gain applied via the gain stage 306 is continuously and dynamically modulated to prevent the limiter 310 from applying excess gain reduction while also avoiding reducing the gain more than necessary for suitable operation of the playback device 110.

While embodiments of the feedback controller 314 that employ only a single TC filter can provide certain benefits over conventional limiting techniques, there are particular advantages to using a plurality of TC filters having different time constants. As noted above, in some embodiments there can be three TC filters: a "fast" TC filer having relatively short attack and release times, an "intermediate" TC filter having intermediate attack and release times, and a "slow" TC filter having relatively slow attack and release times. Each of these TC filters is configured to respond differently to an incoming GR value detected from a limiter. For example, consider audio accompanying a movie in which a relatively quiet dialogue scene abruptly transitions to a series of loud explosions. The dramatic increase in volume might result in the limiter applying relatively high levels of gain reduction. When this high GR value is detected at the feedback controller, the fast TC filter, having relatively short attack and release times, will rapidly begin to decrease this GR value back to a sub-threshold level. Meanwhile, the intermediate TC filter, having longer attack and release times, will take longer to begin to attenuate the GR value, and will also take longer to return the GR value to a sub-threshold level. And at the same time, the slow TC filter, having even longer attack and release times, will take longer still to begin to attenuate the GR value, and will also take even longer to return the GR value to a sub-threshold level. The combination of these three TC filters provides an output in the form of a feedback signal that reflects a GR value that has been evaluated at multiple time scales. This produces a more balanced feedback signal that can respond quickly to high GR values from the limiter (by virtue of the fast TC filter) without causing an oscillating feedback signal (by virtue of the intermediate and slow TC filters). Oscillation can be caused by, for example, a feedback signal that is too directly responsive to the detected GR from the limiter. For example, without the intermediate and slow TC filters, the fast TC filter could result in oscillation of the feedback signal in which the gain stage 306 rapidly cycles between increase and decreasing the gain. This rapid cycling can cause an undesired audible effect known as "pumping and breathing." By combining the fast TC filter with the intermediate and slow TC filters, the feedback signal can provide responsiveness without oscillation.

In one embodiment, functions associated with the feedback controller 314 may be implemented on the playback device. For example, the processor 112a of the playback device may perform functions associated with the described feedback controller 314. In another embodiment, functions associated with the feedback controller 314 may be implemented on a control device used to operate the playback device, such as a smartphone, tablet, desktop computer, laptop computer, etc. In yet another embodiment, functions associated with the feedback controller 314 may be implemented on a computing device in a cloud network. For example, the audio playback device may send an audio signal to be played back to the computing device. Based on the audio signal and knowledge of an arrangement of the playback device, e.g., type of playback device, arrangement of transducers in the playback device, capabilities of the playback device, etc., the computing device may limit the audio signal and provide this signal back to the audio playback device for playback. In another embodiment, functions associated with the feedback controller 314 may be implemented partially on one or more of the computing device, the audio playback device, and the controller in one or more combinations. Other suitable variations are also possible.

In some embodiments, the functions associated with the feedback controller 314 may be implemented on a first playback device configured to transmit audio data to a second playback device. The output of the feedback controller 314 can be applied to the audio data output by the second playback device. For instance, as described above with respect to FIG. 1, the first and second playback devices may be configured to operate as a "bonded zone" or a "stereo pair" in which the first and second playback devices output left and right channels, respectively, of a multi-channel audio signal. The feedback controller 314 on the first playback device, for example, can perform one or more functions described above on the multi-channel audio signal prior to transmitting all or a portion of the multi-channel audio signal to the second playback device. In certain embodiments, the functions associated with the feedback controller 314 are distributed among the first and second playback devices. Additional details regarding audio playback synchronization among playback devices can be found, for example, in U.S. Pat. No. 8,234,395, which was incorporated by reference above.

Figure 4:
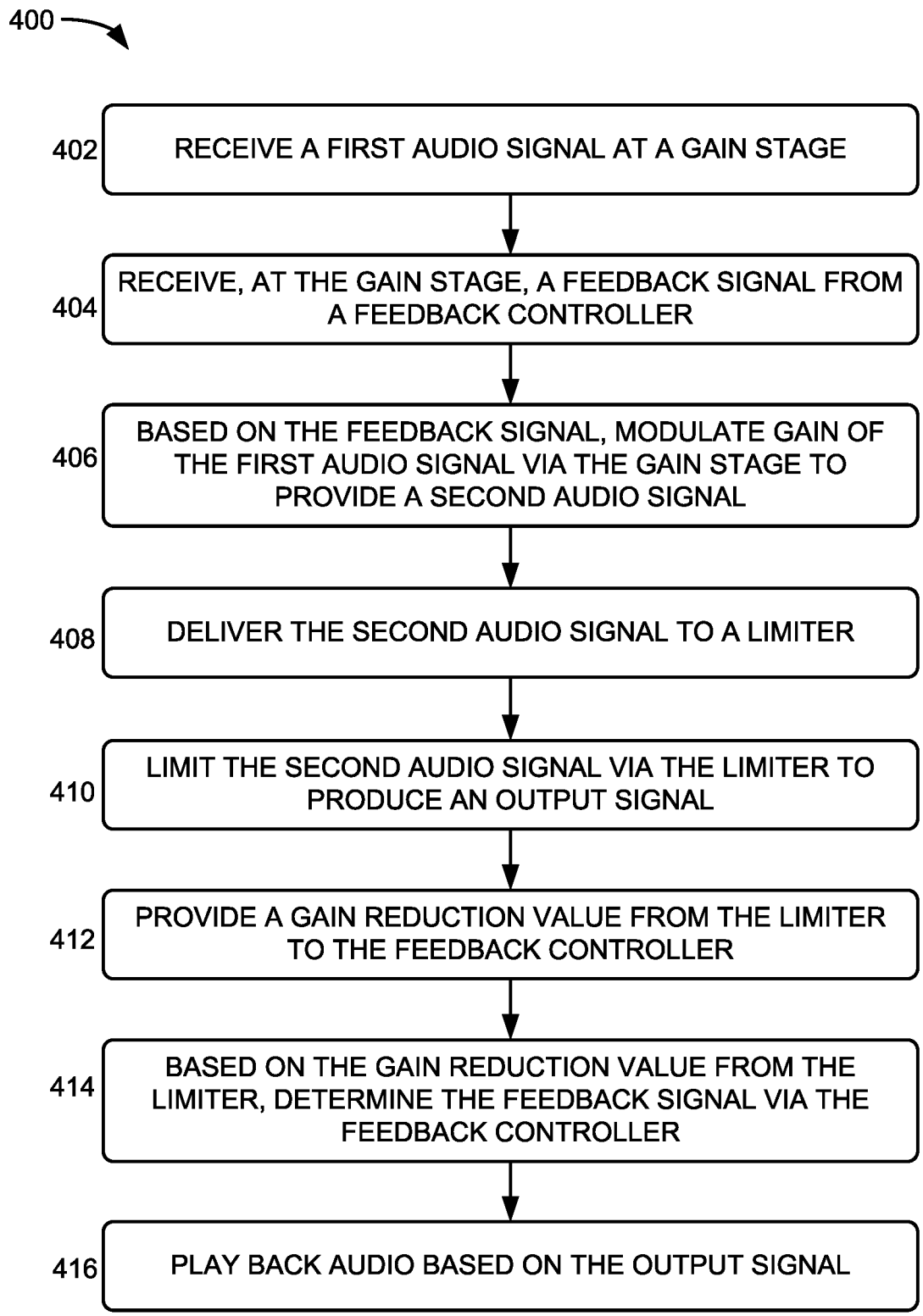
FIG. 4 is a flow diagram of a process for limiting volume in a playback device in accordance with aspects of the present technology.

FIG. 4 is a flow diagram of a process configured to limit volume in accordance with aspects of the present technology. In some embodiments, the process 400 comprises one or more instructions stored in memory (e.g., the memory 112*b* of FIG. 1) and executed by one or more processors (e.g., the processor 112*a* of FIG. 1) of a playback device (e.g., the playback device 110 of FIG. 1).

At block 402, the process 400 receives a first audio signal at a gain stage. In some examples, the audio signal may be a digital audio signal such as a packetized or non-packetized stream of audio, e.g., 128 bits of audio data. In another example, the audio signal may be an analog signal input from an auxiliary connection. The audio signal may comprise frequency content that ranges from 0 Hz to 22,050 Hz or some subset of this frequency range. The gain stage can be any portion of the audio processing chain within a playback device at which the level of the audio signal is amplified or attenuated.

At block 404, the process 400 receives, at the gain stage, a feedback signal from a feedback controller. And at block 406, the gain stage modulates gain of the first audio signal based at least in part on the feedback signal received from the feedback controller and outputs a second audio signal. As described below, the feedback controller determines the feedback signal based on a gain reduction value received from the limiter. As the limiter applies more gain reduction to the audio signal, the feedback controller can provide a feedback signal to cause the gain stage to decrease the amount of gain applied to the incoming signal. This in turn can lead to reducing the amount of gain reduction applied at the limiter, thereby improving audio quality. Additionally, as the limiter applies less and even no gain reduction to the audio signal, the feedback controller can provide a feedback signal to cause the gain stage to increase the amount of gain applied to the incoming signal, thereby avoiding unnecessarily reducing the gain via the gain stage and improving performance of the playback device.

At block 408, the process 400 delivers the second audio signal from the gain stage to a limiter and at block 410, the limiter limits the second audio signal to produce an output signal. As described above, the limiter can reduce (e.g., clip) portions of the audio signal that exceed predetermined thresholds to protect a transducer or other components of the playback device from exceeding their operational limits. The limiter can be digital (e.g., software running on a processor) or analog (e.g., circuit elements such as capacitors, resistors, inductors, etc. configured to limit the signal). In some embodiments, there may be intervening components between the gain stage and limiter, for example a dynamic bass control or other audio processing component.

At block 412, a gain reduction value from the limiter is provided to the feedback controller. The gain reduction value can be a time-varying function as the limiter can apply different levels of gain reduction to the audio signal over time. The gain reduction is delivered to the controller and, at block 414, the feedback controller determines the feedback signal that is applied to the gain stage in block 404. As noted above, this feedback signal can cause the gain stage to increase the amount of gain applied if the gain reduction value from the limiter is high, or the feedback signal can instruct the gain stage to decrease the amount of gain applied if the gain reduction value from the limiter is low or even zero. In some cases, the feedback signal may cause the gain stage to make no change to the amount of gain applied to the incoming signal.

To improve performance of the feedback signal, the feedback controller can perform a number of operations on the gain reduction value received from the limiter to determine the feedback signal. For example, similar to the examples described above with respect to FIG. 3B, the feedback controller can apply a plurality of time constant (TC) filters to the gain reduction value from the limiter, with one or more of the TC filters having different time constants (e.g., attack and/or release times). By providing TC filters having different time constants (e.g., fast, intermediate, and slow TC filters), overall performance of the feedback controller can be improved. For example, the feedback controller can determine a feedback signal that both responds quickly to abrupt changes in gain reduction from the limiter, while also smoothing the feedback signal provided to the gain stage to avoid oscillation or unduly abrupt changes in gain that would produce audible artifacts.

At block 416, audio is played back based on the output signal from the limiter. For example, the audio signal can be output from the limiter to one or more transducers (e.g., transducers 214*a-f* of FIG. 2B) that can play back the audio signal. In various embodiments, there may be a number of intervening audio processing components between the limiter and the transducers, for example cross-over circuitry, digital-to-analog converters, etc.

While the methods and systems have been described herein with respect to media content (e.g., music content, video content), the methods and systems described herein may be applied to a variety of content which may have associated audio that can be played by a media playback system. For example, pre-recorded sounds which might not be part of a music catalog may be played using the playback device. Other examples are possible including podcasts, news clips, notification sounds, alarms, etc.

VII. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. An audio signal processing system for a playback device, the system comprising:
   a gain stage configured to (i) receive an incoming first audio signal and a control signal and (ii) generate a second audio signal, wherein generating the second audio signal comprises adjusting a gain of the first audio signal based at least in part on the control signal;
   a dynamic bass control stage configured to (i) receive the second audio signal and (ii) generate a third audio signal, wherein generating the third audio signal comprises attenuating a low-frequency portion of the second audio signal;
   a wideband limiter configured to (i) receive the third audio signal and (ii) generate a fourth audio signal, wherein generating the fourth audio signal comprises reducing a gain of the third audio signal;
   a feedback controller configured to produce a control signal based at least in part on a gain reduction applied via the limiter and to provide the control signal to the gain stage; and
   an audio amplifier configured to cause audio to be played back based on the fourth audio signal.

2. A playback device comprising:
   the audio signal processing system of claim 1; and
   a power source configured to supply energy to the audio signal processing system.

3. The playback device of claim 2, wherein the power source comprises at least one of:
   one or more batteries; or
   a power-over-ethernet interface.

4. The playback device of claim 2, wherein the wideband limiter is configured to maintain the playback device within its operational limits, the operational limits comprising one or more of a voltage limit, a current limit, an energy limit, or a power limit.

5. The playback device of claim 2, wherein the control signal produced by the feedback controller is configured to maintain the playback device within its operational limits, the operational limits comprising one or more of a voltage limit, a current limit, an energy limit, or a power limit.

6. The system of claim 1, wherein:
   the dynamic bass control stage is configured to attenuate only the low-frequency portion of the second audio signal while not attenuating a high-frequency portion of the second audio signal; and
   the wideband limiter is configured to reduce the gain for both a low-frequency portion of the third audio signal and a high-frequency portion of the third audio signal.

7. The system of claim 1, wherein the wideband limiter is configured to reduce gain across a full frequency range of the third audio signal.

8. The system of claim 1, wherein the gain reduction value reflects an amount of gain reduction applied by the limiter.

9. A method, comprising:
   receiving a first audio signal at a gain stage;
   receiving a control signal at the gain stage;
   based at least in part on the control signal, generating a second audio signal via the gain stage, wherein generating the second audio signal comprises adjusting a gain of the first audio signal;
   receiving the second audio signal at a dynamic bass control stage;
   generating a third audio signal via the dynamic bass control stage, wherein generating the third audio signal comprises attenuating a low-frequency portion of the second audio signal;
   receiving the third audio signal at a wideband limiter;
   generating a fourth audio signal via the wideband limiter, wherein generating the fourth audio signal comprises reducing a gain of the third audio signal;
   producing the control signal via a feedback controller based at least in part on the gain reduction applied via the wideband limiter; and
   playing back audio based on the fourth audio signal.

10. The method of claim 9, further comprising supplying energy to the gain stage, the dynamic bass control stage, the wideband limiter, and the feedback controller.

11. The method of claim 10, wherein supplying energy comprises providing energy from at least one of:
    one or more batteries; or
    a power-over-ethernet interface.

12. The method of claim 10, wherein the wideband limiter maintains a playback device within its operational limits, the operational limits comprising one or more of a voltage limit, a current limit, an energy limit, or a power limit.

13. The method of claim 10, wherein the control signal produced by the feedback controller maintains a playback device within its operational limits, the operational limits comprising one or more of a voltage limit, a current limit, an energy limit, or a power limit.

14. The method of claim 9, wherein:
    the dynamic bass control stage attenuates only the low-frequency portion of the second audio signal while not attenuating a high-frequency portion of the second audio signal; and
    the wideband limiter reduces the gain for both a low-frequency portion of the third audio signal and a high-frequency portion of the third audio signal.

15. The method of claim 9, wherein the wideband limiter reduces gain across a full frequency range of the third audio signal.

16. The method of claim 9, wherein the gain reduction value reflects an amount of gain reduction applied by the limiter.

17. One or more tangible, non-transitory computer-readable media storing instructions that, when executed by one or more processors of a playback device, causing the playback device to perform operations comprising:
    receiving a first audio signal at a gain stage;
    receiving a control signal at the gain stage;
    based at least in part on the control signal, generating a second audio signal via the gain stage, wherein generating the second audio signal comprises adjusting a gain of the first audio signal;
    receiving the second audio signal at a dynamic bass control stage;
    generating a third audio signal via the dynamic bass control stage, wherein generating the third audio signal comprises attenuating a low-frequency portion of the second audio signal;
    receiving the third audio signal at a wideband limiter;

generating a fourth audio signal via the wideband limiter, wherein generating the fourth audio signal comprises reducing a gain of the third audio signal;

producing the control signal via a feedback controller based at least in part on the gain reduction applied via the wideband limiter; and playing back audio based on the fourth audio signal.

18. The one or more computer-readable media of claim 17, wherein the wideband limiter maintains the playback device within its operational limits, the operational limits comprising one or more of a voltage limit, a current limit, an energy limit, or a power limit.

19. The one or more computer-readable media of claim 17, wherein the control signal produced by the feedback controller maintains the playback device within its operational limits, the operational limits comprising one or more of a voltage limit, a current limit, an energy limit, or a power limit.

20. The one or more computer-readable media of claim 17, wherein:

the dynamic bass control stage attenuates only the low-frequency portion of the second audio signal while not attenuating a high-frequency portion of the second audio signal; and the wideband limiter reduces the gain for both a low-frequency portion of the third audio signal and a high-frequency portion of the third audio signal.

* * * * *